United States Patent
Miller et al.

[11] Patent Number: 6,151,010
[45] Date of Patent: Nov. 21, 2000

[54] DIGITAL OSCILLOSCOPE DISPLAY AND METHOD THEREFOR

[75] Inventors: Martin T. Miller, Avully/Geneve; Stephen T. Dye, Versoix; Roland Gamper, Meyrin, all of Switzerland

[73] Assignee: LeCroy, S.A., Switzerland

[21] Appl. No.: 08/653,288

[22] Filed: May 24, 1996

[51] Int. Cl.$^7$ .................................................. G09G 5/36
[52] U.S. Cl. .......................................... 345/134; 345/147
[58] Field of Search ................................... 345/147, 134, 345/133, 148, 150, 153, 154; 324/121 R, 76.13; 364/487, 579

[56] References Cited

U.S. PATENT DOCUMENTS

| | | | |
|---|---|---|---|
| 3,995,259 | 11/1976 | Harris et al. | 345/134 |
| 4,736,327 | 4/1988 | Power | 345/134 |
| 4,829,293 | 5/1989 | Schlater | 340/722 |
| 5,003,248 | 3/1991 | Johnson | 324/121 R |
| 5,254,983 | 10/1993 | Long et al. | 345/147 |
| 5,283,596 | 2/1994 | Long | 345/134 |
| 5,412,579 | 5/1995 | Meadows et al. | 364/487 |
| 5,434,593 | 7/1995 | Lecklider et al. | 345/134 |
| 5,495,168 | 2/1996 | de Vries | 324/121 R |

FOREIGN PATENT DOCUMENTS

| | | | |
|---|---|---|---|
| 0 347 901 A2 | 12/1989 | European Pat. Off. | G01R 13/26 |
| 0 631 143 A2 | 12/1994 | European Pat. Off. | G01R 13/40 |
| 0 677 746 A2 | 10/1995 | European Pat. Off. | G01R 13/34 |
| 2 271 043 | 3/1994 | United Kingdom | G01R 13/26 |
| 2 295 948 | 12/1994 | United Kingdom | G01R 13/34 |

*Primary Examiner*—Dennis-Doon Chow
*Attorney, Agent, or Firm*—Hamilton, Brook, Smith & Reynolds, P.C.

[57] ABSTRACT

A digital oscilloscope in which the acquisition/data accumulation is decoupled from the display of the accumulated data in order to increase the speed at which new data may be accumulated and displayed. The invention also provides for variable persistence in the accumulated data so that the displayed image shows the changes in the sampled event over time. The decay, however, is proportional to population for each amplitude/time combination in the data. This maintains the statistical integrity of the data. Further, the data from each channel is assigned a different color and different populations within the channel's data is assigned a different shade of the color. These shades are dynamically updated as data from new acquisitions are accumulated. In order to highlight the population distributions in the rare events, population saturation levels may be specified.

24 Claims, 8 Drawing Sheets

| | | | | | | |
|---|---|---|---|---|---|---|
| C0 | C0 | C0 | C0 | C0 | C0 | C0 |
| C0 | C0 | C0 | C0 | C0 | C0 | C1 |
| C0 | C0 | C0 | C0 | C0 | C1 | C1 |
| C0 | C0 | C0 | C0 | C0 | C2 | C3 |
| C0 | C0 | C1 | C1 | C1 | C5 | C7 |
| C0 | C0 | C2 | C1 | C5 | C9 | C9 |
| C1 | C2 | C3 | C4 | C9 | C8 | C8 |
| C2 | C2 | C5 | C9 | C7 | C6 | C6 |
| C3 | C4 | C9 | C5 | C2 | C4 | C3 |
| C6 | C9 | C4 | C1 | C1 | C2 | C4 |
| C8 | C6 | C2 | C1 | C0 | C1 | C2 |
| C4 | C3 | C1 | C0 | C0 | C0 | C1 |
| C3 | C2 | C1 | C0 | C0 | C0 | C0 |
| C2 | C1 | C0 | C0 | C0 | C0 | C0 |
| C0 | C0 | C0 | C0 | C0 | C0 | C0 |
| C0 | C0 | C0 | C0 | C0 | C0 | C0 |
| C0 | C0 | C0 | C0 | C0 | C0 | C0 |

| | | | | | | |
|---|---|---|---|---|---|---|
| C0 | C0 | C0 | C0 | C0 | C0 | C0 |
| C0 | C0 | C0 | C0 | C0 | C0 | C1 |
| C0 | C0 | C0 | C0 | C0 | C8 | C7 |
| C0 | C0 | C0 | C0 | C0 | C9 | C9 |
| C0 | C0 | C1 | C2 | C5 | C9 | C9 |
| C0 | C0 | C9 | C7 | C9 | C9 | C9 |
| C5 | C9 | C9 | C9 | C9 | C9 | C9 |
| C9 | C9 | C9 | C9 | C9 | C9 | C9 |
| C9 | C9 | C9 | C9 | C9 | C9 | C9 |
| C9 | C9 | C9 | C5 | C2 | C9 | C9 |
| C9 | C9 | C9 | C2 | C0 | C2 | C9 |
| C9 | C9 | C1 | C0 | C0 | C0 | C1 |
| C9 | C9 | C1 | C0 | C0 | C0 | C0 |
| C9 | C5 | C0 | C0 | C0 | C0 | C0 |
| C0 | C0 | C0 | C0 | C0 | C0 | C0 |
| C0 | C0 | C0 | C0 | C0 | C0 | C0 |
| C0 | C0 | C0 | C0 | C0 | C0 | C0 |

| | | | | | | |
|---|---|---|---|---|---|---|
| C0 | C0 | C0 | C0 | C0 | C0 | C0 |
| C0 | C0 | C0 | C0 | C0 | C0 | C0 |
| C0 | C0 | C0 | C0 | C0 | C0 | C0 |
| C0 | C0 | C0 | C0 | C0 | C0 | C0 |
| C0 | C0 | C0 | C0 | C0 | C0 | C4 |
| C0 | C0 | C0 | C0 | C0 | C8 | C8 |
| C0 | C0 | C0 | C0 | C8 | C7 | C6 |
| C0 | C0 | C0 | C9 | C4 | C2 | C3 |
| C0 | C0 | C8 | C0 | C0 | C0 | C0 |
| C2 | C9 | C0 | C0 | C0 | C0 | C0 |
| C7 | C2 | C0 | C0 | C0 | C0 | C0 |
| C0 | C0 | C0 | C0 | C0 | C0 | C0 |
| C0 | C0 | C0 | C0 | C0 | C0 | C0 |
| C0 | C0 | C0 | C0 | C0 | C0 | C0 |
| C0 | C0 | C0 | C0 | C0 | C0 | C0 |
| C0 | C0 | C0 | C0 | C0 | C0 | C0 |
| C0 | C0 | C0 | C0 | C0 | C0 | C0 |

| 218 | | | | 216 | | | |
|---|---|---|---|---|---|---|---|
| 0 | 0 | 0 | 0 | 0 | 0 | 0 | 0 |
| 0 | 0 | 0 | 0 | 0 | 0 | 0 | 1 |
| 0 | 0 | 0 | 0 | 0 | 0 | 8 | 7 |
| 0 | 0 | 0 | 0 | 0 | 0 | 10 | 20 |
| 3 | 0 | 0 | 1 | 2 | 5 | 40 | 62 |
| 19 | 0 | 0 | 12 | 7 | 40 | 85 | 81 |
| 75 | 5 | 17 | 22 | 36 | 85 | 78 | 75 |
| 153 | 13 | 18 | 45 | 90 | 65 | 55 | 58 |
| 160 | 28 | 39 | 81 | 40 | 10 | 32 | 20 |
| 133 | 51 | 89 | 39 | 5 | 2 | 10 | 32 |
| 65 | 78 | 51 | 12 | 2 | 0 | 2 | 10 |
| 23 | 32 | 22 | 1 | 0 | 0 | 0 | 1 |
| 11 | 25 | 10 | 1 | 0 | 0 | 0 | 0 |
| 5 | 12 | 5 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| | 157 | 179 | 132 | 47 | 12 | 44 | 62 |

FIG. 2E

DIGITAL OSCILLOSCOPE DISPLAY AND METHOD THEREFOR

BACKGROUND OF THE INVENTION

Digital oscilloscopes fall into two general categories. Single shot oscilloscopes begin sampling an event in real time when a trigger condition is satisfied. The limitations on their sampling speed are determined by the speed of the analog-to-digital converter, and the length of time over which an event may be sampled is limited by the size of the acquisition memory that receives the output from the converter. Random interleave or equivalent time sampling oscilloscopes rely on sampling a recurring event at different points in the event repeatedly over time. A single composite representation of the event is then compiled from each of the samples. In order to prevent aliasing, the time between detection of the trigger condition and the sampling is randomized between samples.

Digital oscilloscopes are seen as an improvement over the earlier analog-type devices in certain respects. In the typical analog oscilloscope, the trace of the electron beam across the phosphorous plane of the cathode ray tube is controlled by the amplitude, e.g., voltage, and time characteristics of the signal being monitored. The vertical displacement of the beam is a function of the instantaneous amplitude, and the beam advances horizontally across the tube at a steady rate in time. Since the signal is not sampled and held in a digital memory, data manipulation and direct comparison to subsequent acquisitions are generally not possible. Statistical analysis is difficult.

Analog oscilloscopes have a number of recognized advantages, however. Higher frequency signals may be monitored since any speed limitations are placed, not by the speed of the analog-to-digital converter, but by the bandwidth of the oscilloscopes' electronics. Further, analog oscilloscopes can monitor the signal continuously or almost continuously. Digital oscilloscopes must capture a signal across the time period allowed by the size of the acquisition memory, then process, and display the signal's representation. The speed at which the digital oscilloscope may make new acquisitions is thus limited by the time it requires to process the previous acquisition.

SUMMARY OF THE INVENTION

The present invention is directed to maintaining the data manipulation flexibility associated with digital oscilloscopes while duplicating some of the display attributes of analog oscilloscopes and adding new features that are supportable by the digital electronics. The invention seeks to achieve the visual characteristics associated with analog oscilloscopes' persistence displays. The invention also provides for variable persistence in the accumulated data so that the displayed image shows the changes in the sampled event over time. The decay, however, is proportional to the population for each amplitude/time combination in the data. This maintains the statistical integrity of the data.

The technique used to display the accumulated data makes the data more easily interpreted by a number of different modifications. The data from each channel is assigned a different color, and different populations within the channel's data are assigned different shades of the color. These shades are dynamically updated as data from new acquisitions are accumulated. Further, in order to highlight the population distributions in the rare events, population saturation levels may be specified.

In general, according to one aspect, the invention features a method for displaying information in a multichannel oscilloscope. This method includes repeatedly sampling amplitudes of events over time and accumulating the sampled data from the events into a persistence map. The map contains population information for each amplitude and time combination. Each channel of the oscilloscope is assigned a different color and different shades of the color are used to represent different populations from the map. Thus, the different population/probability densities for each channel may be readily discriminated on the display device of the oscilloscope.

In specific embodiments, the step of assigning different shades to the populations comprises first determining a maximum population among all amplitude and time combinations for at least one channel of the oscilloscope. The different shades are then assigned in the population ranges between a minimum population and the maximum population. Further, the color shade assignments may be dynamically updated. As further sampling is performed, a new maximum population is determined and the shades assigned based upon this new population. Alternatively, a saturation population and/or a minimum threshold may be specified. The different shades are then assigned to the population ranges between a minimum population, or the threshold, and this saturation population.

In general, according to another aspect, the population information contained in the map is aged for each amplitude and time combination. The aging is proportional and universally applied to at least all amplitude and time combinations for a channel of the oscilloscope.

In general, according to still another aspect, the invention may also be characterized as a digital oscilloscope. This device has multiple channels for sampling different events. Each channel includes an analog to digital converter for sampling amplitudes of the events and a segmented acquisition memory for storing samples from the converter over time for at least one acquisition. A persistence map generator time-aligns samples of the acquisitions from the acquisition memory for at least one channel. The data is then accumulated in a persistence map memory where it is assessable by a display rendering.

In general, according to a further aspect, the invention also concerns a method for displaying amplitude and time histogram information in an oscilloscope. Here, sampled data is accumulated into a persistence map. The user, however, may identify ranges of amplitudes and sampling times, such as by displayed cursers, within the persistence map. Sums of the population information within the ranges are generated and the corresponding histograms displayed.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings:

FIG. 2B shows the assignment of different shades C0-c9 to the populations of the three-dimensional persistence map according to the invention;

FIG. 2C shows the shade assignments when a saturation population is selected according to the invention;

FIG. 2D shows the shade assignments when a threshold population is selected according to the invention;

FIG. 2E shows amplitude and time domain summations that are performed for the histogram generation;

DETAILED DESCRIPTION OF THE PREFERRED EMBODIMENTS

Figure 1:
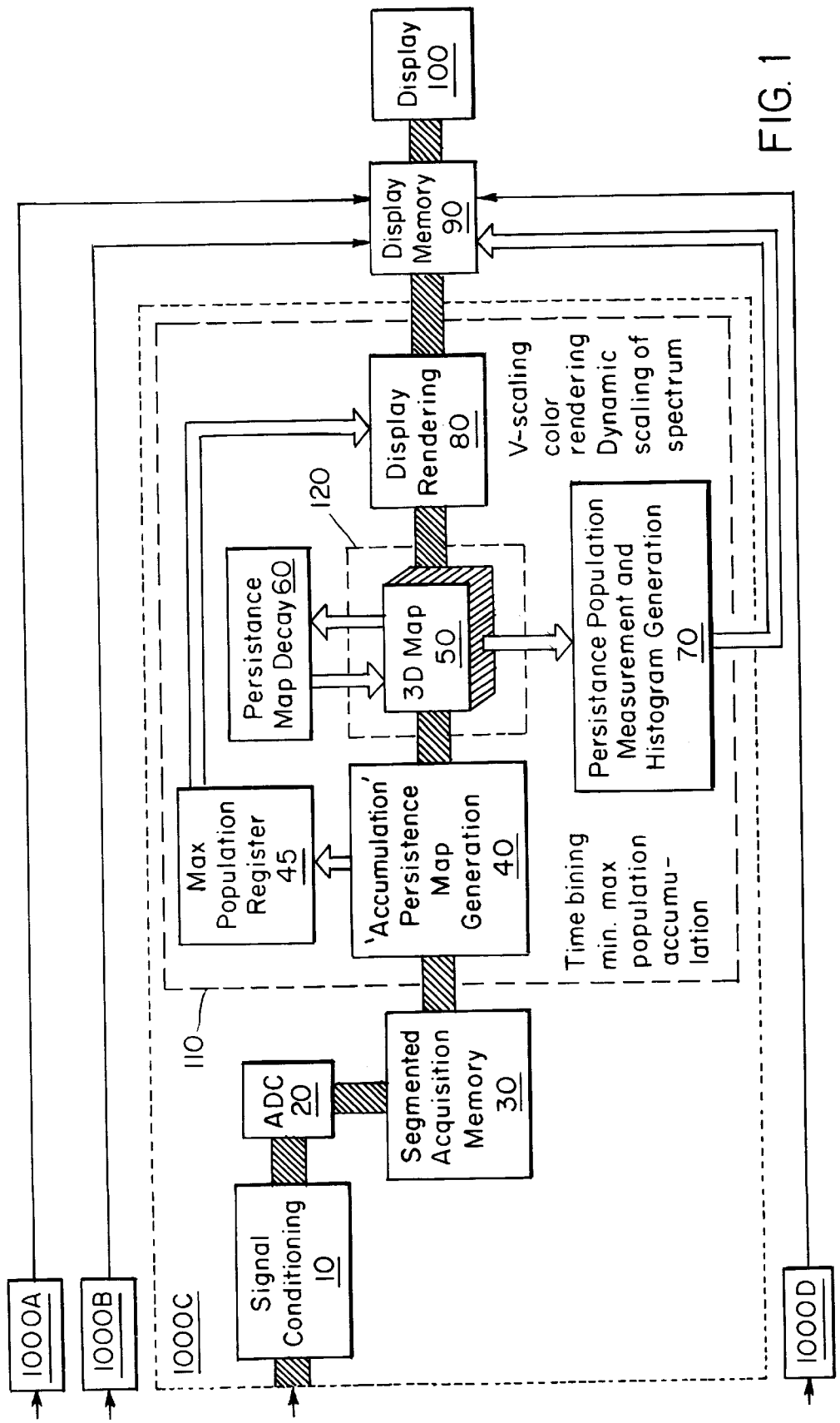
FIG. 1 is a block diagram for an oscilloscope of the present invention.

FIG. 1 shows an oscilloscope that has been constructed according to the principles of the present invention. Generally, the oscilloscope supports a number of separate channels 1000 A–D that each feed display information to a display memory 90. An oscilloscope display 100, such as a color cathode ray tube or a flat panel, presents the display information contained in the display memory 90.

Each of the oscilloscope's channels comprise an input signal conditioning circuitry 10. This provides the high impedance connection to the environment, which is being sampled, and functions as an amplifying and sample-and-hold stage for an analog to digital converter 20.

The analog-to-digital converter 20 is a high speed conversion circuit, 500 mega-samples per second (MS/sec) in one embodiment, that repetitively samples the output of the signal conditioning circuitry 10 and writes the sampled data into a segmented acquisition memory 30, which functions as a circular storage buffer. In more detail, the arming of a trigger circuit, not shown, causes the successive samples from the A/D converter 20 to be written to the acquisition memory 30. A trigger signal terminates this writing, freezing the contents of the memory 30.

The segmented acquisition memory 30 preferably contains 2–5 megabytes (MB) or more of long memory and can be segmented to store multiple acquisitions, such as 2,000 in one embodiment. For example, with a segmented memory of 2 MB, 2000 one kilobyte long acquisitions may be stored simultaneously before any of the data is read out.

The data accumulated in the segmented acquisition memory 30 is provided to an accumulation persistence map generator 40, which performs the horizontal, or time base, scaling. The accumulation persistence map generator 40 converts each sample in the segmented acquisition memory into an amplitude, or voltage, on a common time base. If the acquisition memory has been segmented into a number of different acquisitions, then the various acquisitions are time aligned with respect to each other based upon the trigger point.

Once the acquisitions are time aligned, the samples are accumulated in a memory functioning as a three-dimensional persistence map 50. Two dimensions of the map correspond to amplitude and time combinations, and the third dimension is population. Conceptionized another way, the map holds population counters for each time increment at each possible quantized amplitude.

Each sample is represented on the three-dimensional persistence map 50 by incrementing the population counter at the appropriate amplitude and time location. Multiple samples at the same amplitude and time location from successive acquisitions are represented by the increase in population count for that amplitude and time. The three-dimensional map 50 preferably has 16 bit population counters, although 24 or 32 bits are other alternatives. The analog to digital converter is an 8-bit converter in one embodiment which translates to 256 levels in the voltage dimension of the map. The persistence map generator 40 does, however, compress the time axis in some embodiments. Thus, the three-dimensional persistence map's time axis is less than the two million time increments possible from the 2 MB acquisition memory 30.

A persistence map decay 60 ages the population statistics held in the three-dimensional persistence map 50. In response to a user selected decay time, 0 to 20 sec, for example, the persistence map decay 60 proportionally ages each of the populations at the amplitude and time locations to provide an exponential decay. Periodically, a percentage of the populations of each voltage and time location are decimated based on the user selected decay time. This proportional aging maintains the statistically integrity of the three-dimensional persistence map.

In the example of one embodiment, the user may set the display persistence time between 0 and 20 sec. The selection of the persistence time of 10 sec, for example, causes the persistence map decay 60 to pass over the 3D map 50 every 5 sec., each time decimating one half of the population at every amplitude and time location. User selection of a smaller persistence time causes the persistence map decay 60 to pass over the 3D map at a higher rate; a larger persistence time decreases the rate at which the 3D map 50 is updated. In either case, however, the populations are decimated by a constant percentage, specifically one half.

Alternatively, the populations can be decimated by another percentage, one quarter for example. In this case, the rate at which the map decay 60 passes over the data is increased for the same display persistence setting.

In the approach of another embodiment, the rate at which the persistence map decay 60 passes over the data is the same for each display persistence setting, but the proportion of the populations decimated on each pass is determined in response to the set persistence time. A combination of different pass rates and decimation proportions may be used based on the persistence setting in still other implementation.

The decimation of small populations present some unique issues. In the preferred embodiment, the populations are handled as integers; a population of 2 become 1 and a population of 1 becomes 0 when decimated by ¼, for example. This effectively ages the small populations at a higher rate than the large populations, however. One solution to this effect is to increment each population by 10 for each sample at a particular amplitude and time location. Thus, each location effectively stores fractional populations.

The display rendering 80 converts the amplitude-time-population statistics in the three-dimensional persistence map 50 into pixel information for the oscilloscope display 100. Each of the separate channels 1000 is assigned a different color, such as red, blue, green, and yellow, and each display rendering 80 assigns populations to the 32 different shades of the colors, which the display 100 may produce. The shades of the assigned color may be determined according to a number of different approaches.

The shades can be assigned according to a linear distribution. A maximum population register 45 is accessible by the display rendering 80 and holds the maximum population count of all of the amplitudes and time combinations held in the three-dimensional map 50. This population is automatically assigned the brightest shade of the color that is assigned the particular channel. The zero or smallest population is assigned the darkest shade or background color. The remaining 30 colors are assigned to population ranges between zero and the maximum population.

Figure 2A:
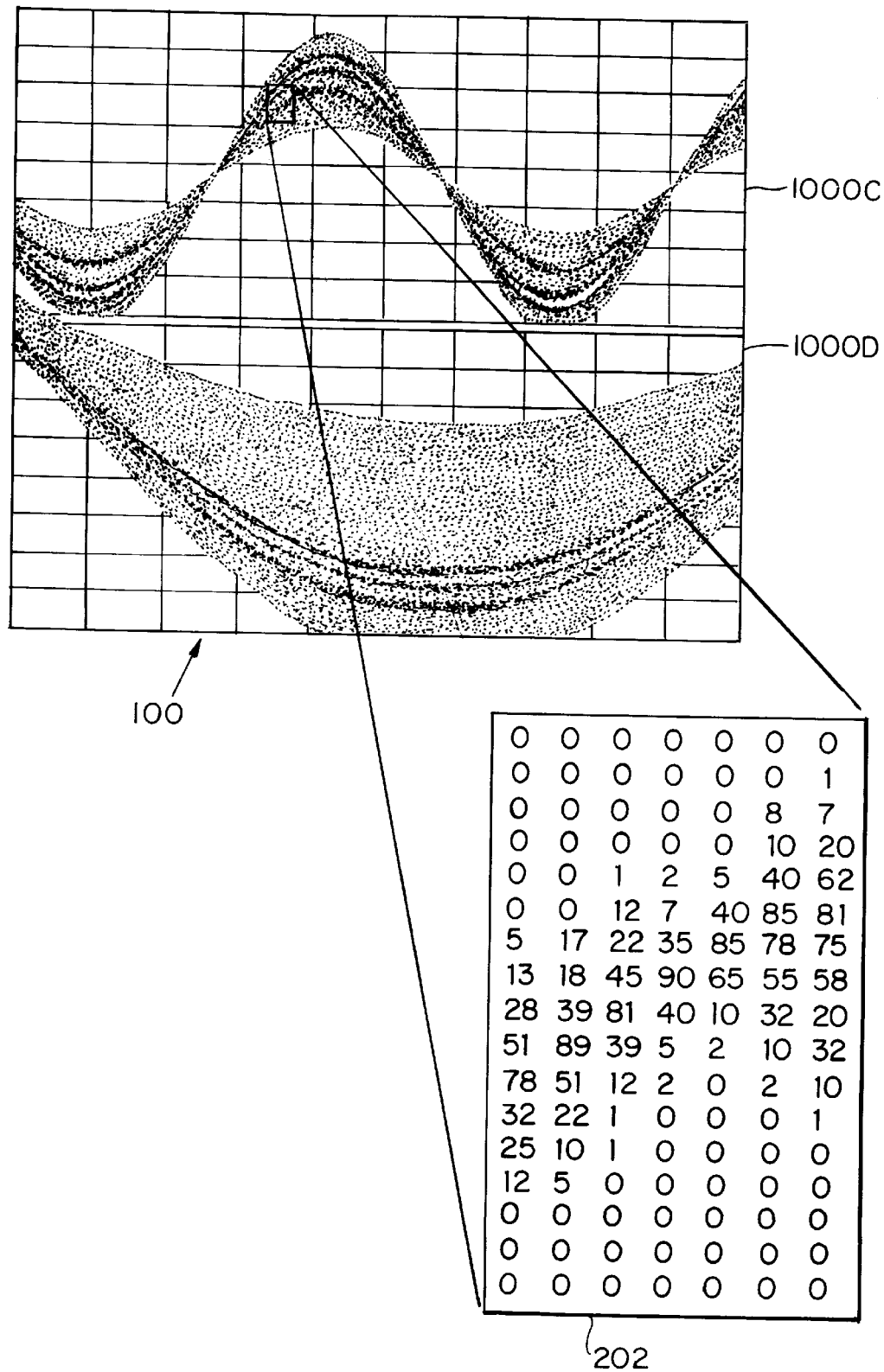
FIG. 2A shows exemplary population distribution for an arbitrary region of the three dimensional persistence map and its correspondence to a displayed image according to the invention.

FIGS. 2A and 2B illustrate an example of this linear color shade distribution. FIG. 2A shows an exemplary set of population distributions 202 taken from the three-dimensional map 50 which corresponds to a portion of the displayed image for one channel 1000C on the display 100. If this portion 202 of the map 50 represents the highest population densities in the total map 50, then the maximum population register 45 would hold a value of 90.

FIG. 2B shows the various populations 0–90 mapped to the available colors C0–C9. In general, the larger populations are assigned the brighter shades, and the smaller populations are assigned the darker shades. In a 10 shade color scheme C0–C9, the brightest shade C9 is assigned to a population range including the maximum population count 90. The darkest shade C0 is assigned the minimum or 0 population. The remaining colors C1–C8 are assigned to population ranges between 0 and 81. For example, color C2 is assigned the population range 11–20, and C3 is assigned the population range 21–30.

As shown in FIG. 2C, a saturation limit may, however, be specified. In many instances, it is the information in the lower populations or down at the noise level that are of most interest—the random transients rather than the dominant signals. The population distributions in these lower populations may be highlighted by setting a specified population level, 9 in the example, as the brightest shade C9, a saturation level. The remaining colors C1–C8 are then assigned the range between zero and the saturation level. Populations above the saturation level are shown in the brightest shade. Alternatively, the saturation may be specified as a percentage of the maximum population. Thus the limit maintains its relevance as new acquisitions are accumulated.

As shown in FIG. 2D, a threshold may also be specified. The threshold represents the opposite effect relative to the saturation limit, i.e., when the small populations should be de-emphasized. Populations below the threshold, 45 in the illustrated example, are commonly assigned to the darkest shade or background color C0. Thus, the infrequent events are not represented in the display. Here again, the threshold may be specified as a percentage of the maximum population The display rendering 80 also in some instances may compress the vertical voltage scale. Many times the images from each of the four channels are simultaneously placed on the display 100, but the display, which is preferably a VGA type, has only 640 vertical pixels or scan lines. Since the voltages are sampled to an 8-bit accuracy, this leaves a total of 256 voltage levels for each of the four channels. Consequently, each sampled voltage level may not be mapped to a unique scan line. The vertical dimension must be compressed if all four channels are simultaneously displayed or expanded if only a single channel is displayed on the screen at once. The remapping of the 256 voltage levels to the region of the display allocated for the channel is performed by the display rendering 80.

Persistence population measurement and histogram generation 70 generates histogram information for amplitudes and/or time periods. As shown in FIG. 2E, persistence population and histogram generation 70 sums populations within the persistence map 50 for each quantized amplitude. The scope of the summations across the time axis is limited by user adjusted right and left time scale cursers 216, 218. Similarly, a population histogram for various sampling times may also be generated. These summations are performed between the top and bottom amplitude cursers 212, 214. The histogram generation 70 then converts these summations 222, 220 into display information and then updates the display memory.

Figure 3:
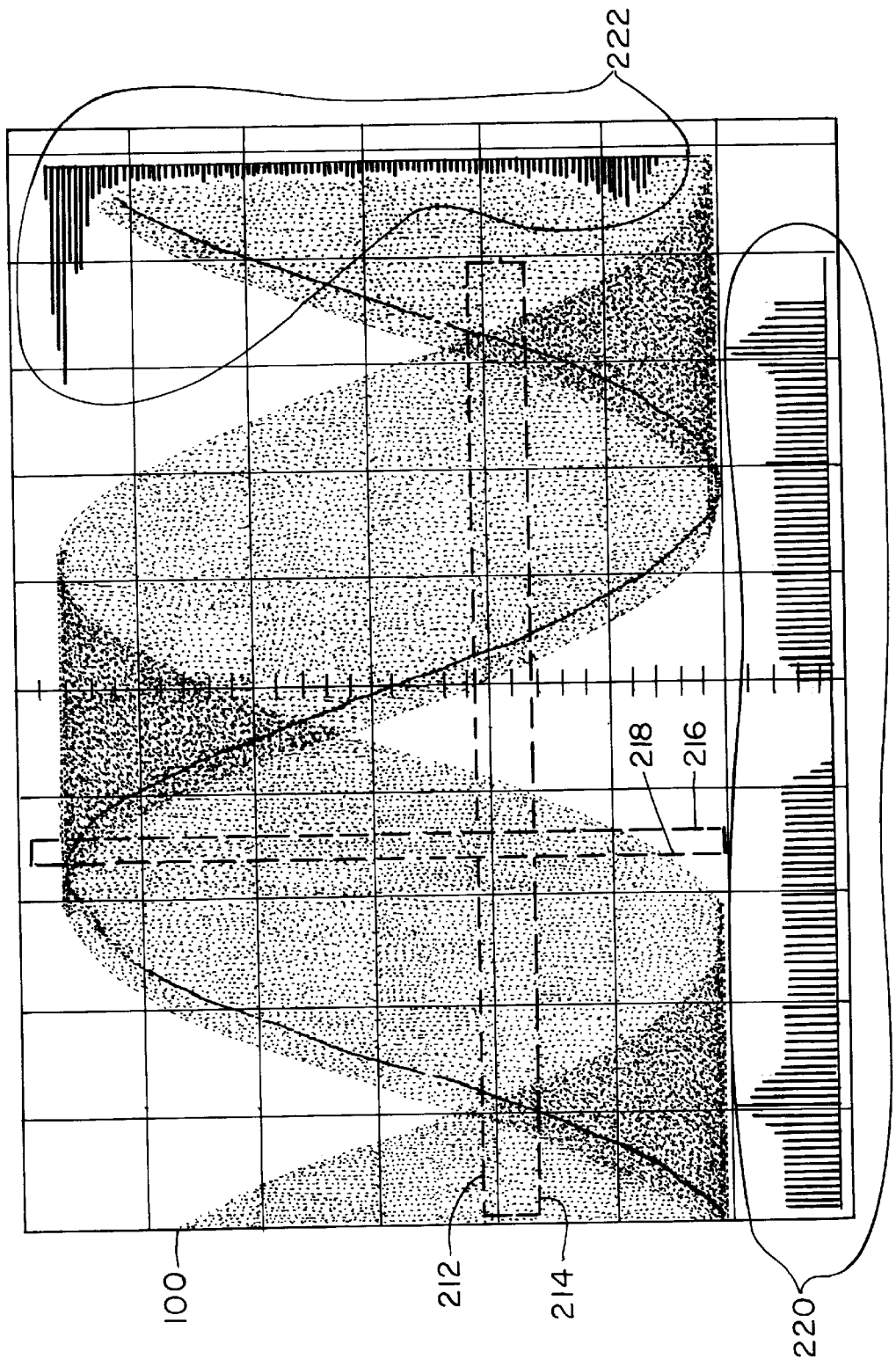
FIG. 3 shows an exemplary displayed image based upon the 3D persistence map and histogram generation.

FIG. 3 shows an example of an oscilloscope display according to the present invention. (Note that the figure is actually in reverse video. Typically, the background would be dark, and the regions of higher populations are progressively lighter.) The histogram 220 for the sampling times are displayed across the bottom of the screen, and the amplitude histogram 222 is displayed vertically on the right side of the screen. As shown, the histograms become larger when there are greater populations for the signal as limited by the cursers 216 and 218, 212 and 214.

In preferred embodiment, the persistence map generation 40, max population register 45, persistence map decay 60, persistence population measurement and histogram generation 70, and the display rendering 80 represent functionality performed by a microprocessor 110 and are implemented as program procedures in an instruction memory that is accessible by the microprocessor 110. The three dimensional map 50 is a data structure located in data memory 120 that is addressable by the microprocessor 110. Alternatively, some or all of the functions 40–80 could be implemented with application specific integrated circuits or programmable hardware devices. While restricting generality, this approach can be made to achieve faster processing speeds.

Figure 4:
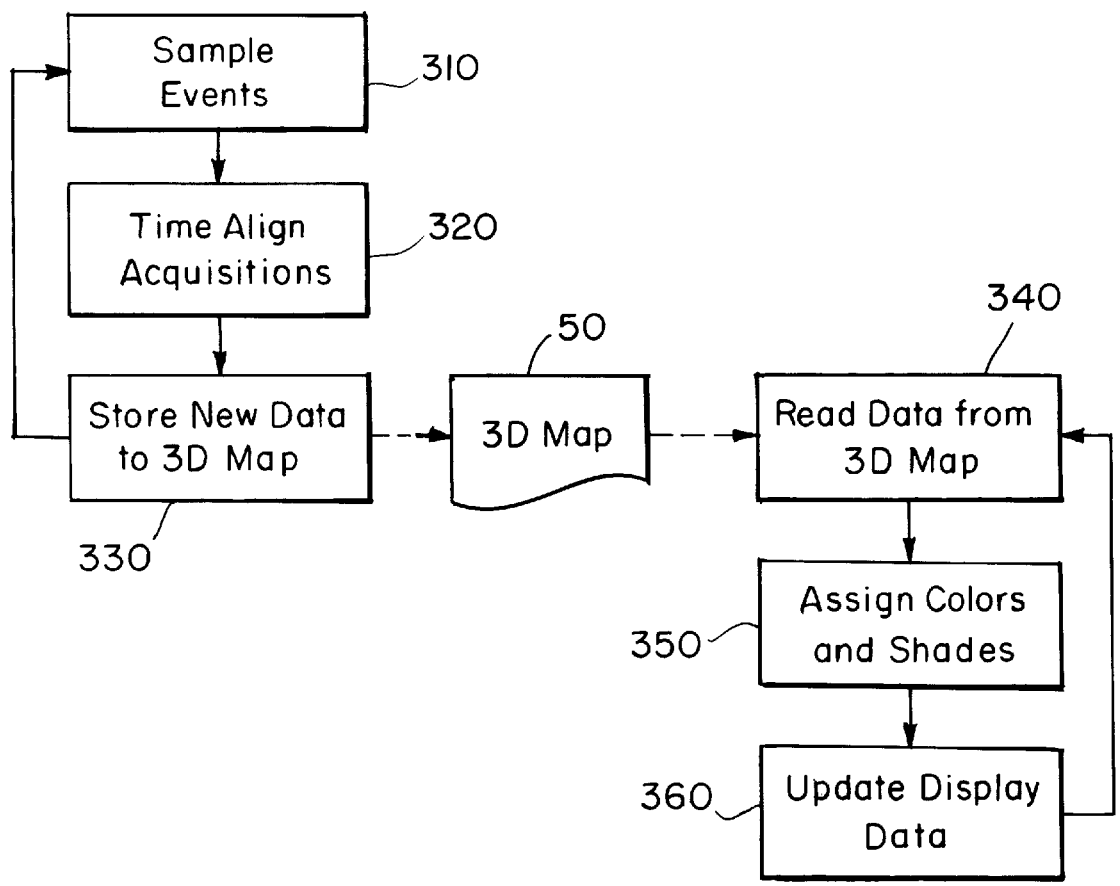
FIG. 4 is a process diagram showing the dynamic color shade assignments and the independence of acquisitions from data display in the inventive oscilloscope.

As shown in FIG. 4, the display occurs dynamically and independently of the timing of new acquisitions. In step 310, the events are sampled by freezing the contents of the segmented acquisition memory 30. Next, the new acquisitions are time aligned with respect to each other by the persistence map generator 40 in step 320. The new set of populations are stored to the three-dimensional map 50 in step 330 before the next acquisition is made in step 310.

The three-dimensional map memory 50 functions as a two port memory that is also addressable by the display rendering based upon the user entered saturation and threshold populations. Data is read out in step 340 by the display rendering 90, which reassigns the shades of the color to the new populations in step 350. The display image stored in the display memory is then updated in step 360. Thus, the shades are dynamically reassigned as the oscilloscope accumulates more information from new acquisitions.

While this invention has been particularly shown and described with references to preferred embodiments thereof, it will be understood by those skilled in the art that various changes in form and detail may be made therein without departing from the spirit and scope of the invention as defined by the appended claims.

We claim:

1. A method for displaying information in a multichannel oscilloscope, comprising:

repeatedly sampling amplitudes of events over time;

accumulating sampled data from the events into a persistence map that contains population information for amplitude and time combinations;

determining a saturation and/or threshold population for the amplitude and time combinations;

displaying information from the persistence map on a display device of the oscilloscope; and visually differentiating different population ranges that have been defined in response to the saturation and/or threshold population.

2. A method for displaying information as described in claim 1, wherein the step of visually differentiating different populations comprises:

determining a maximum population among all amplitude and time combinations for at least one channel of the oscilloscope;

assigning different shades to the population ranges between a minimum population or the threshold population and the maximum population or the saturation population.

3. A method for displaying information as described in claim 2, further comprises:

performing further sampling of amplitudes of events over time;

accumulating the new sampled data into the persistence map;

determining a new maximum population; and reassigning the different shades to new population ranges between the minimum population or threshold population and the new maximum population, as long as it is less than any selected saturation population.

4. A method for displaying information as described in claim 1, wherein the step of assigning different shades to the populations comprises:

determining a threshold population for the amplitude and time combinations;

assigning the different shades of the assigned color to the population ranges between the threshold population and the maximum population.

5. A method maintaining persistence information in an oscilloscope, comprising:

repeatedly sampling amplitudes of events over time;

accumulating sampled data from the events into a persistence map that contains population information for amplitude and time combinations;

proportionally aging the population information for each amplitude and time combination.

6. A method maintaining persistence information as described in claim 5, wherein the step of proportionally aging the population information comprises reducing the population for each amplitude and time combination with a periodicity determined in response to a user selected persistence time.

7. A method maintaining persistence information as described in claim 5, wherein the step of proportionally aging the population information comprises periodically reducing the population for each amplitude and time combination by a fraction determined in response to a user selected persistence time.

8. A digital oscilloscope comprising:

multiple channels for sampling different events, each channel including:

an analog to digital converter for sampling amplitudes of the events, a segmented acquisition memory for storing samples from the converter over time for at least one acquisition;

a persistence map generator for time-aligning samples of the acquisitions from the acquisition memory;

a persistence map for storing population information for amplitude and time combinations for at least one channel;

display rendering which visually differentiates population information from each of the channels and population ranges in response to a selected saturation population and/or threshold population; and an oscilloscope display device for displaying the visually differentiated population information.

9. A digital oscilloscope as described in claim 8, further comprising:

maximum population register which stores a maximum population of all the amplitude and time combinations for at least one of the channels; and wherein the display rendering assigns different shades of an assigned color to the population ranges between a minimum population and the maximum population from the population register, as long as the maximum population does not exceed any selected saturation population.

10. A digital oscilloscope as described in claim 9, wherein the display rendering assigns different shades of an assigned color to new population ranges in response to changes in the maximum population from the population register.

11. A digital oscilloscope as described in claim 8, further comprising:

maximum population register which stores a maximum population of all the amplitude and time combinations for at least one of the channels; and wherein the display rendering assigns different shades of an assigned color to the population ranges between a threshold population and the maximum population from the population register, as long as the maximum population does not exceed any selected saturation population.

12. A digital oscilloscope as described in claim 8, wherein the display rendering visually differentiates population ranges between a user entered saturation population and a minimum population.

13. A digital oscilloscope comprising:

multiple channels for sampling different events, each channel including:

an analog to digital converter that samples amplitudes of the events, a segmented acquisition memory that stores samples from the converter over time for at least one acquisition;

a persistence map generator that time-aligns samples of the acquisitions from the acquisition memory;

a persistence map that stores population information for amplitude and time combinations for at least one channel;

persistence aging that proportionally reduces populations for the amplitude and time combinations;

display rendering that converts the persistence map into a displayable image; and an oscilloscope display device for displaying the population information.

14. A digital oscilloscope as described in claim 13, wherein the persistence aging proportionally reduces the population for each amplitude and time combination with a periodicity determined in response to a user selected persistence time.

15. A digital oscilloscope as described in claim 13, wherein the persistence aging periodically reduces the population for each amplitude and time combination by a fraction determined in response to a user selected persistence time.

16. A method for displaying amplitude and time histogram information in an oscilloscope, comprising:

repeatedly sampling amplitudes of events over time;

accumulating sampled data from the events into a persistence map that contains population information for amplitude and sampling time combinations;

enabling user identification of a range of amplitudes within the persistence map;

generating sums of the population information within the amplitude range for various sampling times;

displaying histograms representing the sums for sampling times;

enabling user identification of a range of sampling times within the persistence map;

generating sums of the population information within the range of sampling times for various amplitudes;

displaying histograms representing the sums for amplitudes.

17. A method for displaying amplitude and time histogram information as described in claim 16, further comprising displaying information from the persistence map on a display device of the oscilloscope.

18. A method for displaying amplitude and time histogram information as described in claim 17, wherein the range of amplitudes are identified by amplitude cursers that are displayed with the information from the persistence map and are adjustable by the user.

19. A method for displaying amplitude and time histogram information as described in claim 18, wherein the range of sampling times are identified by time cursers that are displayed with the information from the persistence map and are adjustable by the user.

20. A method for displaying amplitude and time histogram information as described in claim 17, wherein the range of sampling times are identified by time cursers that are displayed with the information from the persistence map and are adjustable by the user.

21. A method for displaying amplitude and time histogram information in an oscilloscope, comprising:

repeatedly sampling amplitudes of events over time;

accumulating sampled data from the events into a persistence map that contains population information for amplitude and sampling time combinations;

enabling user identification of a range of amplitudes within the persistence map;

generating sums of the population information within the amplitude range for various sampling times; and displaying histograms representing the sums for the sampling times.

22. A method for displaying amplitude and time histogram information in an oscilloscope, comprising:

repeatedly sampling amplitude of events over time;

accumulating sampled data from the events into a persistence map that contains population information for amplitude and sampling time combinations;

enabling user identification of a range of sampling times within the persistence map;

generating sums of the population information within the range of sampling times for various amplitudes;

displaying histgrams representing the sums for amplitudes.

23. A method for displaying information in a multichannel oscilloscope, comprising:

repeatedly sampling amplitudes of events over time;

accumulating sampled data from the events into a persistence map that contains population information for amplitude and time combinations;

determining a saturation population for the amplitude and time combinations;

displaying information from the persistence map on a display device of the oscilloscope; and visually differentiating different population ranges, which have been defined in response to the saturation population.

24. A method for displaying information in a multichannel oscilloscope, comprising:

repeatedly sampling amplitudes of events over time;

accumulating sampled data from the events into a persistence map that contains population information for amplitude and time combinations;

determining a threshold population for the amplitude and time combinations;

displaying information from the persistence map on a display device of the oscilloscope; and visually differentiating different population ranges, which have been defined in response to the threshold population.

* * * * *